United States Patent [19]
Lada, Jr. et al.

[11] Patent Number: 5,142,247
[45] Date of Patent: Aug. 25, 1992

[54] MULTIPLE FREQUENCY PHASE-LOCKED LOOP CLOCK GENERATOR WITH STABLE TRANSITIONS BETWEEN FREQUENCIES

[75] Inventors: Henry F. Lada, Jr.; Hung Q. Le, both of Houston; James H. Garrett, Spring; John M. Gromala, Houston, all of Tex.

[73] Assignee: Compaq Computer Corporation, Houston, Tex.

[21] Appl. No.: 741,083

[22] Filed: Aug. 6, 1991

[51] Int. Cl.⁵ .................... H03L 7/099; H03L 7/18
[52] U.S. Cl. ................................ 331/14; 331/2; 331/16; 331/25; 331/49
[58] Field of Search .................. 331/1 A, 2, 14, 16, 331/25, 49

[56] References Cited

U.S. PATENT DOCUMENTS 3,899,746  8/1975  Gammel .................... 331/14 X
5,036,216  7/1991  Hohmann et al. ............ 331/1 A Primary Examiner—Siegfried H. Grimm
Attorney, Agent, or Firm—Vinson & Elkins

[57] ABSTRACT

A phase-locked loop (PLL) clock generator circuit which is capable of changing the frequency of its outpt clock signal in a stable fashion. Selection of the frequency of the output clock signal is made by way of a selectable frequency divider coupled between the reference clock signal and an input of the PLL, with another frequency divider in the feedback loop of the PLL; each of these frequency dividers are selectable according to a signal on a select bus, translated by way of a ROM look-up table. The circuit also includes a multiplexer having a first input coupled to the PLL output, and a second input coupled to a stable clock signal, for example to the referenc clock signal or to the output of a fixed frequency PLL. The conrol input of the multiplexer is controlled by a state machine which monitors the select bus. Responsive to detection of a transition of the select bus, indicating a new frequency, the state machine issues a pulse to the control input of the multiplexer to cause it to select the stable clock signal for sufficient time to allow the PLL to acquire and lock onto the new frequency, after which the multiplexer again selects the PLL output as the output clock signal. As a result, the unstable and non-linear behavior at the PLL output does not appear at the output of the circuit, with a stable clock signal at a safe frequency appearing thereat during the PLL transitional cycles.

28 Claims, 1 Drawing Sheet

MULTIPLE FREQUENCY PHASE-LOCKED LOOP CLOCK GENERATOR WITH STABLE TRANSITIONS BETWEEN FREQUENCIES

This invention is in the field of data processing systems, and is more particularly directed to clock signal generator circuits therein.

BACKGROUND OF THE INVENTION

Modern high-performance data processing systems, such as personal computers and workstations, generally include a number of components such as microprocessors, memories, logic devices of various functions and the like, the operation of which is controlled by a clock signal. As the performance requirements for such systems continue to become more stringent, the frequency of the clock signals which control these synchronous components also increases. For example, systems including clocks of frequencies in excess of 30 MHz are now readily available.

A particularly critical system function is that which generates the graphic image, as the refresh frequency of the video display must be at least 60 Hz for the refresh to be invisible to the user. As the number of pixels displayed increases with the resolution of the displayed image, the rate at which the pixels are clocked out of the graphics hardware (i.e., the pixel, or dot, clock rate) must also increase, due to the refresh frequency limitation. Dot clock frequencies of on the order of 40 to 50 MHz are not uncommon in modern high performance workstations with high resolution displays.

A rudimentary technique for generating clock signals in a data processing system uses crystal oscillators. Crystal oscillators are simple in implementation, but are limited in the frequencies which they can generate. Accordingly, in recent years the use of phase-locked loops (PLLs) as clock generators has become more popular. As is well known in the art, a PLL includes a phase detector which compares the input reference signal to a feedback signal and generates an error signal according to the phase differential. The error signal is filtered by a low-pass filter and applied to a voltage controlled oscillator which generates the PLL output, and also the feedback signal to the phase detector circuit. In many modern PLLs, the phase detector includes a charge pump for converting the digital output of the phase detector into analog signals suitable for controlling the voltage controlled oscillator, via the low-pass filter. Generation of clock signals by use of a PLL offers several advantages over the use of crystal oscillator clock generator circuits, as a single PLL is capable of providing clock signals at one of a number of selectable frequencies, thus reducing the board space and component cost from that required if implemented with crystal oscillators. In some cases, the electromagnetic interference (EMI) generated by the system can also be reduced by use of PLL-based clock generator circuits.

However, when PLLs are used to generate clock signals of multiple frequencies, the instability of the output of the PLL circuit when switching from one frequency to another presents problems to the data processing system. In particular, a dynamic transition in the frequency presented to a PLL circuit can cause non-linear effects and undershoot or overshoot of frequency at the output of the PLL and thus presented to the circuits controlled by the PLL output. These effects may be particularly troublesome for graphics applications.

Referring to FIG. 1, the construction and operation of a conventional PLL clock generator circuit 10 will now be described. Clock generator circuit 10 is capable of generating a clock signal on line CLOCK at one of several selectable frequencies, based upon a single reference clock signal received on line REF. PLL subsystem 12 in clock generator circuit 10 includes source frequency divider 16 which receives the reference clock signal from line REF and presents the input clock signal to a conventional PLL 14, at a frequency which is divided down from the reference clock signal. The output of PLL 14 at line CLOCK also generates a feedback signal via feedback frequency divider 18. In this arrangement, the frequency of the output clock signal will be that of the reference clock signal times the ratio of the multiple of feedback frequency divider 18 over the multiple of source frequency divider 16. As such, a wide range of frequencies are available from circuit 10, including both divided-down and divided-up frequencies from that of the reference clock signal. PLL 14 is a conventional integrated phase-locked loop circuit, such as an HCT7046A manufactured and sold by Philips Components, and selectable frequency dividers 16, 18 are also conventional, such as the 74LS718 manufactured and sold by Motorola.

Frequency dividers 16, 18 are each controllable to divide the frequency at their input to one of several selectable multiples, depending upon the value of select inputs applied thereto. In the conventional system of FIG. 1, ROM 20 receives an address on bus SEL, and applies a corresponding value to the inputs of each of frequency dividers 16, 18. Accordingly, the value of the address on select bus SEL selects the multiple of the reference frequency that PLL subsystem 12 is to present as the clock signal on line CLOCK, by selecting the multiples of frequency dividers 16, 18.

The operation of the system of FIG. 1 is quite stable once the output frequency is selected and once PLL 14 has acquired the frequency. However, a new value presented on bus SEL to ROM 15 to select a new multiple for either or both of frequency dividers 16, 18 will cause a transition period during which PLL 14 is not "locked" onto a frequency. During this acquisition time, the clock signal generated by PLL 14 on line CLOCK is essentially indeterminate, and indeed may overshoot or undershoot the desired frequency (depending upon whether the new frequency is higher or lower than the previous frequency), to a frequency outside of the acceptable design limits of the components controlled by the CLOCK signal. Such frequency divergence can cause malfunction of those components which receive the clock signal on line CLOCK. If the clock signal on line CLOCK is used to synchronize memory read/write cycles, such as those used in graphics applications, this frequency divergence can cause erroneous or missed memory cycles which can often lead to the system "hanging up" in a non-recoverable state; it is therefore critical in many of these systems that the CLOCK signal be a stable and known frequency at all times.

Modern PLL components have the low-pass filter integrated into the same integrated circuit as its phase detector and VCO. This integration of the filter into the component generally improves the short-term frequency stability (i.e., reduces the "bit-jitter") of the PLL component, as well as reduces its cost and increases its reliability. Bit-jitter is particularly troublesome in graphics systems using PLL-based clock generator circuits. However, since the capacitor value must be relatively small (e.g., less than 100 pF) in order to economically be included on the same integrated circuit, the overshoot and undershoot problem noted above is exacerbated by the lowering of the PLL damping coefficient which results from a smaller integrated capacitor.

Prior solutions to the problem of PLL overshoot have had certain limitations and problems. One such solution is to design PLL 14 to have a high-impedance state (i.e., "tri-state" output), so that during transitional periods, the output of PLL 14 on line CLOCK presents a high impedance instead of a periodic signal at an incorrect frequency. Since many high performance systems require a clock signal at all times, however, this solution is often unavailable.

Another prior solution to this problem is to increase the RC time constant of the low-pass filter in PLL 14. This slows the response of PLL 14 to the input of the VCO, and thus to changes in its output frequency, avoiding the generation of output clock signals at unacceptable frequencies during transitional cycles. However, this solution requires the low-pass filter to be external to PLL subsystem 12, since the value of a capacitor within a monolithic integrated circuit is limited by chip area. While use of a larger external filter to increase the damping coefficient of the PLL response can avoid transitional overshoot and undershoot, this approach can adversely affect the short-term stability (i.e., the "bit-jitter"), due to noise from other circuits in the system picked up by the external filter. In addition, the larger filter may also slow the PLL response to such a degree that the transition from one frequency to another is slower than desired. The addition of external components also increases the manufacturing cost and board space requirements of the system.

By way of further background, multiplexers have been used which allow for selection of one of several high frequency clock signals responsive to a select signal. An example of a conventional clock generator including such a multiplexer is the ICD 2051 oscillator manufactured and sold by IC Designs of Kirkland, Washington, where one of two clock signals, including the reference clock signal, may be selected according to a number of select inputs for application as the output signal.

It is an object of this invention to provide a PLL-based clock generator circuit which provides a stable clock signal during transitions from one output frequency to another.

It is another object of this invention to provide such a clock generator circuit which operates responsive to the frequency transition without requiring an external control signal.

It is another object of this invention to provide such a clock generator circuit which applies the new frequency from the PLL without requiring an external control signal.

It is a further object of this invention to provide such a clock generator circuit which is suitable for high frequency, high performance operation, such as necessary for modern graphics systems.

It is a further object of this invention to provide such a clock generator circuit which allows the PLL to have an internal low-pass filter and improved stability.

Other objects and advantages of the present invention will be apparent to those of ordinary skill in the art having reference to the following specification together with the drawings.

SUMMARY OF THE INVENTION

The invention may be incorporated into a clock generator circuit including a phase-locked loop (PLL) which generates an output clock signal based upon a reference clock signal, according to the values of source and feedback frequency dividers with selectable multiples. The output of the PLL and a stable clock signal, such as the reference clock signal, are each presented to a multiplexer, the output of which presents the output clock signal of the clock generator circuit. A logic circuit, such as a state machine, detects a transition in the signal used to select the multiple of the frequency divider, and responsive to such a transition generates a pulse to the multiplexer to cause it to select the stable clock signal for application to the output. The duration of the pulse is selected so that the non-linear effects and overshoot or undershoot of the output frequency appearing at the output of the PLL is not presented on the output clock signal. The PLL output is presented as the output clock signal after such time as the PLL has acquired the new frequency.

DETAILED DESCRIPTION OF THE PREFERRED EMBODIMENT

Figure 1:
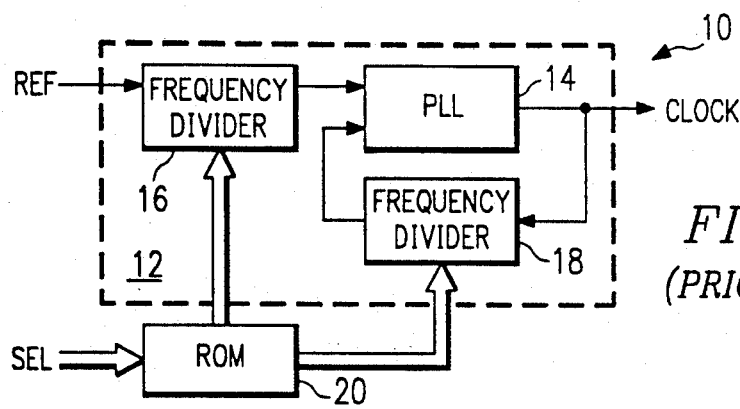
FIG. 1 is an electrical diagram, in block form, of a PLL-based clock generator circuit according to the prior art.
Figure 2:
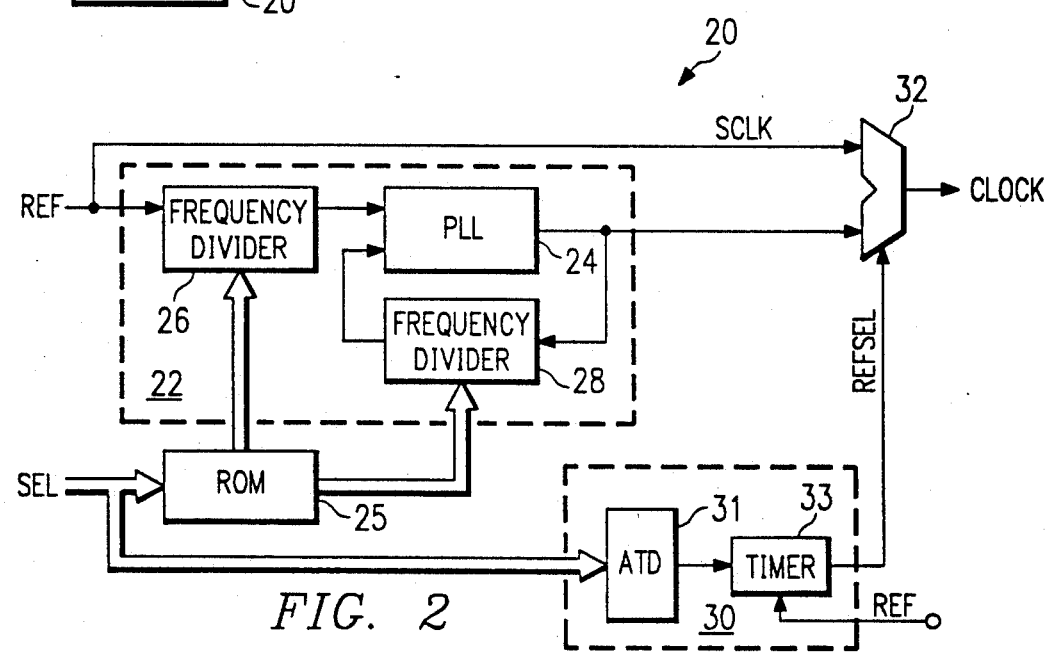
FIG. 2 is an electrical diagram, in block form, of a PLL-based clock generator circuit according to the preferred embodiment of the invention.

Referring now to FIG. 2, the construction of clock generator circuit 20 according to the preferred embodiment of the invention will now be described in detail. Clock generator circuit 20 includes phase-locked loop (PLL) subsystem 22, which generates the clock signal at the desired frequency. PLL subsystem 22 includes PLL 24, which is a conventional PLL such as the HCT7046A manufactured and sold by Philips Components; as is conventional for PLLs in the art, PLL 24 includes a phase detection circuit which receives an input and a feedback signal and which generates an error voltage, via a charge pump, according to the phase difference therebetween. This error voltage is applied to an internal low-pass RC filter, preferably formed within the PLL integrated circuit, which filters the error signal for application to a voltage controlled oscillator (VCO) within PLL 24; the VCO generates the output of PLL 24.

In PLL subsystem 22 according to this embodiment of the invention, selectable frequency dividers 26, 28 are provided to select the frequency of the output clock signal to be generated. Frequency dividers 26, 28 are conventional selectable frequency dividers as are readily available, an example of which is the 74LS718 manufactured and sold by Motorola, and which divides down the input frequency by multiples of from one to fifteen (multiple dividers may be used in series, if the multiple is to be yet larger). The input of source frequency divider 26 receives the reference clock signal on line REF, and its output is connected to the reference input of PLL 24. Feedback frequency divider 28 is in the feedback loop of PLL subsystem 22, and as such receives the output of PLL 24 at its input, and presents its output to the feedback input of PLL 24. Each of frequency dividers 26, 28 receives control signals from ROM 25 which selects the multiple to be used thereby. ROM 25 receives an address value from select bus SEL, and is a look-up translation table, translating the value on select bus SEL into the appropriate signals for application to frequency dividers 26, 28.

In the alternative to ROM 25, other circuits for receiving a signal for selecting the frequency multiples of frequency dividers 26, 28 may be used. For example, a read/write memory may be used into which the look-up table contents are stored, accessed by select bus SEL. A decoder circuit or other combinational logic may also be used which decodes one or more lines of select bus SEL to generate control signals for selecting the multiples of frequency dividers 26, 28. Further in the alternative, a serial-in parallel-out register may be used to receive a serial sequence of control bits which, when applied in parallel to frequency dividers 26, 28, select the appropriate multiples thereof. It is contemplated that other alternatives for controlling the selection of the multiples of frequency dividers 26, 28 will now be apparent to those of ordinary skill in the art having reference to this specification.

As is well known, the frequency of the clock signal generated by PLL subsystem 22 is the product of the frequency of the reference clock signal on line REF times the ratio of the multiple of feedback frequency divider 28 to the multiple of source feedback frequency divider 26. Accordingly, the clock signal generated by PLL subsystem can have a frequency which can vary over a wide range, including frequencies both higher and lower than that of the reference clock signal, and which are not necessarily at integral multiples thereof. Accordingly, changing the control signals to either one of frequency dividers 26, 28 will cause selection of a new frequency for the clock signal generated by PLL subsystem 22. Additional clock signal frequency range may be achieved by implementing another frequency divider at the output of PLL 24.

According to the preferred embodiment of the invention, clock generator circuit 20 further includes frequency multiplexer 32, which allows for selection of the clock signal to be applied to line CLOCK, which is driven by the output of multiplexer 32 (by way of conventional buffers, if desired). Multiplexer 32 receives the output of PLL 24 at a first input, and a stable clock signal at a second input. The stable clock signal applied to multiplexer 32, according to the present invention, is stable in that it does not vary during the transitional time during which PLL 24 is acquiring the new frequency, as will be described in detail hereinbelow. In this example, the reference clock signal on line REF serves as the stable clock signal to multiplexer 32, as it is already available to clock generator circuit 20, making its use particularly efficient.

Alternatively, especially if the stability of the reference clock signal on line REF is not sufficient, or if its frequency is not appropriate, the output of another PLL (preferably operating at a fixed frequency) may be applied to the second input of multiplexer 32 as the stable clock signal.

The selection made by multiplexer 32 is controlled by a signal applied to its control input on line REFSEL. In this preferred embodiment of the invention, state machine 30 drives line REFSEL responsive to the state of select bus SEL, which is connected to inputs of state machine 30. State machine 30 is configured in such a manner as to perform the functions of (i) detecting a transition in the value on select bus SEL, and (ii) generating a pulse on line REFSEL for a period of time responsive to such a transition. The polarity of the pulse generated on line REFSEL by state machine 30 is that which causes multiplexer 32 to select the stable clock signal on line SCLK (i.e., the reference clock signal on line REF, in this embodiment of the invention) for application to line CLOCK, rather than the output of PLL 24.

According to the present invention, the duration of the pulse on line REFSEL is such that the stable clock signal on line SCLK is selected during the time that PLL 24 is acquiring the new frequency (i.e., its output frequency is unstable or not locked). After this time, line REFSEL returns to the level which causes multiplexer 32 to select the output of PLL 24 (which is stable at the new frequency) for application to line CLOCK.

According to this embodiment of the invention, state machine 30 includes such logic as to detect transitions of a multiple bit bus, and to generate a pulse responsive thereto. For example, state machine 30 may include address transition detection (ATD) circuit 31 coupled to each of the lines of select bus SEL, which generates a signal responsive to a transition of the logic level on any one of the lines; such circuits suitable for use as ATD circuit 31 are well known in the art, particularly as used in modern static random access memory (SRAM) devices. State machine 30 further includes timer 33 for generating a pulse on line REFSEL for the desired duration responsive to ATD circuit 31 detecting a transition on select bus SEL. Timer 33 may be configured according to any well known design; in this example, timer 33 preferably includes a counter and a comparator, configured in such a manner as to initiate the pulse on line REFSEL responsive to ATD circuit 31 detecting a transition, and to maintain the pulse for a predetermined number of cycles of a clock signal (e.g., the reference clock signal on line REF), after which it returns line REFSEL to the prior state. The number of cycles is selected so that the pulse duration exceeds the time necessary for PLL 24 to acquire and lock onto the new frequency.

Other well know implementations of the timer function will of course be apparent to those of ordinary skill in the art having reference to this specification. An example of an alternative is the use of an RC network which is charged up responsive to the detection of a transition on select bus SEL, with the pulse width on line REFSEL determined by the time constant of the RC network. Further in the alternative, circuitry may also be included which controls state machine 30 so that it monitors the operation of PLL 24 (e.g., the output of PLL 24, or a signal from the phase detector portion thereof), and maintains the pulse on line REFSEL for so long as PLL 24 is in its transitional state. It is contemplated that other alternatives and modifications to this function, and also other functions useful in performing the task of timer 33, will now be apparent to those of ordinary skill in the art having reference to this specification.

Figure 3:
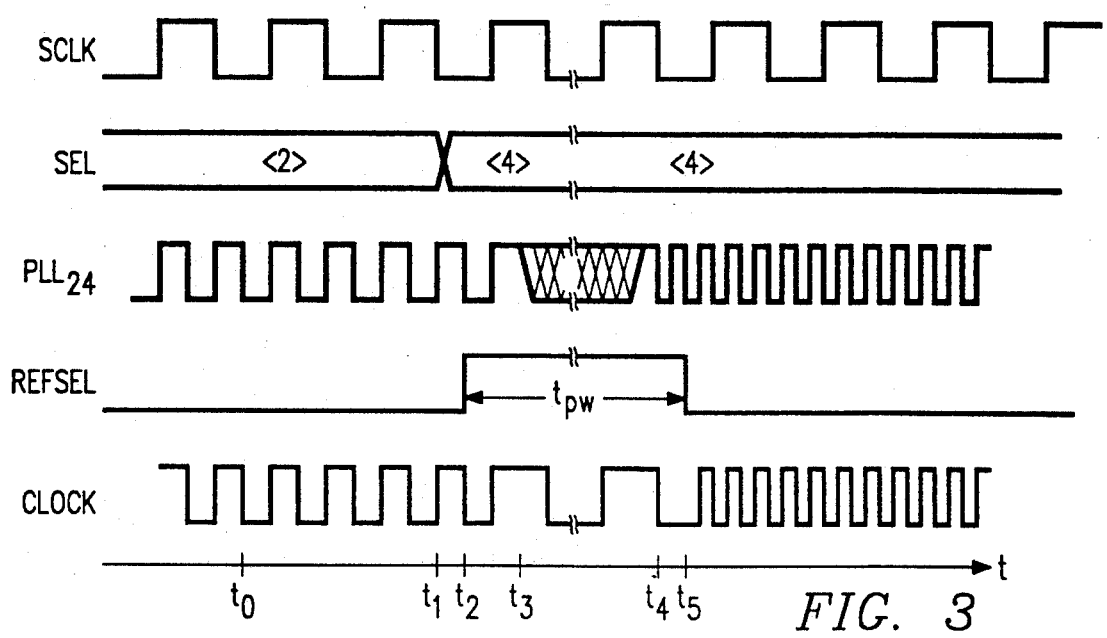
FIG. 3 is a timing diagram illustrating the operation of the clock generator circuit of FIG. 2.

Referring now to FIG. 3, the operation of clock generator circuit 20 of FIG. 2 constructed according to the preferred embodiment of the invention will now be described in detail relative to an example of a transition of frequency thereof. At the initial stage of this example (see time $t_0$ of FIG. 3), clock generator circuit 20 is presenting a clock signal on line CLOCK which has a frequency twice that of the stable clock signal on line SCLK (in this case, that of the reference clock signal on line REF), and has been doing so for some time. At this point, the value on select bus SEL corresponds to that value which, when decoded by ROM 25, results in the ratio of the multiple of feedback frequency divider 28 to the multiple of source frequency divider 26 being equal to two. The output of PLL 24 (line $PLL_{24}$ of FIG. 3) is thus stable, at twice the reference clock signal frequency on line REF and, since no transition of the value at select bus SEL has occurred for some time, line REFSEL is driven low by state machine 30. Multiplexer 32 thus applies the output of PLL 24 to line CLOCK as the output clock signal.

In this example, at time $t_1$, the value applied to select bus SEL changes from that corresponding to twice the reference clock frequency to that corresponding to four times the reference clock frequency. This is accomplished by selecting different multiples for either or both of frequency dividers 26, 28 to arrive at a ratio of four. Responsive to the transition on select bus SEL, state machine 30 issues a high logic level pulse on line REFSEL (at time $t_2$ of FIG. 3) to frequency multiplexer 32. Responsive to the high logic level on line REFSEL at its control input, multiplexer 32 selects the stable clock signal on line SCLK for application to line CLOCK as the output clock signal. Accordingly, after time $t_2$, the clock signal appearing at line CLOCK at the output of clock generator circuit 20 matches that of the stable clock signal on line SCLK which, in this example, is the reference clock signal received on line REF.

Since the clock signal on line SCLK is not affected by the transition in the frequency desired from PLL subsystem 22, it will accordingly be relatively stable during the period of time necessary for PLL 24 to acquire the new frequency. In the system of FIG. 2, after ROM 25 issues the new value to frequency dividers 26, 28, one or both of frequency dividers 26, 28 will present a signal at its output which is at a new frequency. For some time, depending upon the acquisition time of PLL 24, the inputs to PLL 24 will not be in phase with one another, or at the same frequency, and therefore PLL 24 will not yet have acquired the new frequency based on the new ratio. Until such time as PLL 24 has acquired the new frequency, the output of PLL 24 may be at some divergent frequency which is unacceptable to other components using the clock signal on line CLOCK. In this example, since the PLL frequency is increasing from twice that of the reference clock signal to four times that of the reference clock signal, overshoot may occur if the damping coefficient is less than about 0.7, causing the transitional cycles at the output of PLL 24 to have a higher frequency than the new frequency; in the case where the frequency is being reduced, undershoot will occur, such that the output of PLL 24 will be at a lower frequency than that desired. Smaller capacitor values in the low-pass filter of PLL 24 will reduce the damping coefficient, as the damping coefficient is proportional to the square root of the low-pass filter capacitance; PLLs with internal low-pass filters are thus especially susceptible to overshoot and undershoot. The divergent frequency state at the output of PLL 24 in the system of FIG. 2 is illustrated in FIG. 3 on line $PLL_{24}$ in FIG. 3, beginning at time $t_3$.

If the divergent (either excessively high or excessively low) frequencies at the output of PLL 24 during transitional cycles appear on the output clock signal, significant system problems may result. For example, where the clock signal on line CLOCK is used to synchronize memory accesses, if the divergent transitional frequencies at the output of PLL 24 appeared on line CLOCK, the system may experience erroneous or missed memory cycles and hang up. However, in the system of FIG. 2, line REFSEL has been at a high logic level since prior to time $t_3$ at which the unstable operation of PLL 24 began, causing multiplexer 32 to instead present the stable clock signal on line SCLK on line CLOCK. Line REFSEL remains at a high logic level for a predetermined time, selected according to the transition characteristics of PLL 24 and the maximum acquisition time from one frequency to another; this duration is illustrated in FIG. 3 as time $t_{pw}$. During time $t_{pw}$, PLL 24 has sufficient time to acquire and lock onto the new frequency, and to begin applying a signal of the desired frequency and phase at its output, as shown at time $t_4$. At time $t_5$, duration $t_{pw}$ expires, line REFSEL returns to a low logic level, and multiplexer 32 again selects the output of PLL 24 for application to line CLOCK. As a result, even though the transition of frequencies applied to PLL 24 causes its unstable operation and non-linear effects at its output, the system of FIG. 2 isolates the output line CLOCK from such operation of PLL 24, maintaining a stable and safe clock reference signal at its output.

The present invention therefore eliminates the risk of system hang-up and the like as a result of the PLL clock signal frequency transition. This elimination of risk is obtained without losing the benefits of PLL clock generation, including the ability to select among various frequencies of operation. In addition, neither the response time of the PLL in the clock generator nor its short-term stability (i.e., bit-jitter) is compromised in eliminating non-linear clock generator operation and undershoot or overshoot of the output frequency, as internal RC components in the PLL low-pass filter may still be used (rather than external passive components). Furthermore, control of the selection of the stable reference clock versus PLL output is accomplished according to the preferred embodiment without requiring external control of the system, as address transition is used for detection of the change in frequency and as a self-contained timing mechanism can control the duration of the selection pulse.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:
1. A clock generator circuit, comprising:
a phase-locked loop, coupled to receive a reference clock signal;
means, coupled to an input of said phase-locked loop and to a select input, for selecting a frequency multiple of said reference clock signal to be generated by said phase-locked loop;

a multiplexer, having a first input coupled to the output of said phase-locked loop, having a second input for receiving a stable clock signal, having an output, and having a control input for selecting said first or second input to be coupled to said output; and means, coupled to said select input of said selecting means, and to said control input of said multiplexer, for controlling said multiplexer to select said stable clock signal for a duration of time following a transition at said select input.

2. The circuit of claim 1, wherein said selecting means comprises:
a first frequency divider, having an input coupled to receive said reference clock signal, having a control input coupled to said select input, and having an output coupled to a first input of said phase-locked loop.

3. The circuit of claim 2, wherein said selecting means further comprises:
a second frequency divider, having an input coupled to the output of said phase-locked loop, having a control input coupled to said select input, and having an output coupled to a feedback input of said phase-locked loop.

4. The circuit of claim 3, wherein said selecting means further comprises:
a memory, having an address input coupled to said select input, and having an output coupled to said control input of said first and second frequency dividers, for translating the value of the signal at said select input into a control signal for said first and second frequency dividers.

5. The circuit of claim 1, wherein said selecting means comprises:
a frequency divider, having an input coupled to the output of said phase-locked loop, having a control input coupled to said select input, and having an output coupled to a feedback input of said phase-locked loop.

6. The circuit of claim 1, wherein said controlling means comprises sequential logic.

7. The circuit of claim 1, wherein said controlling means comprises:
means for detecting a transition of said select input; and
means, responsive to said detecting means, for generating a pulse for application to said multiplexer.

8. The circuit of claim 7, wherein said generating means comprises:
a timer.

9. The circuit of claim 8, wherein said timer comprises:
a counter for counting reference clock cycles; and
a comparator, for comparing the output of said counter to a time value, and for ending said pulse responsive to said counter equaling said time value.

10. The circuit of claim 8, wherein said timer comprises: an RC network.

11. The circuit of claim 7, wherein said generating means comprises means for monitoring said phase-locked loop so that said pulse is presented to said multiplexer during transitional cycles at the output of said phase-locked loop.

12. A circuit for generating a clock signal, comprising:
a phase-locked loop having a first input coupled to receive a reference clock signal;
a first frequency divider, coupled to an input of said phase-locked loop, and coupled to a select input, for selecting a frequency multiple of said reference clock signal to be generated by said phase-locked loop;
an output control circuit, coupled to receive the output of said phase-locked loop and a stable clock signal, having an output corresponding to the output of the circuit, for monitoring said select input for transitions thereat, and for applying said stable clock signal at its output for a selected duration following a transition at said select input.

13. The circuit of claim 12, wherein said output control circuit comprises:
logic circuitry having an input coupled to said select input, and having an output, for monitoring transitions of said select input and for generating a pulse at its output responsive thereto; and
a multiplexer, having a first input coupled to the output of said phase-locked loop, having a second input coupled to said stable clock signal, having a control input coupled to the output of said logic circuitry, and having an output for presenting said output of said phase-locked loop or said stable clock signal responsive to signals received at its control input.

14. The circuit of claim 12, wherein said output of said first frequency divider is coupled to a first input of said phase-locked loop;
wherein of said first frequency divider has an input coupled to receive said reference clock signal;
and wherein said phase-locked loop has a feedback input coupled to the output of said phase-locked loop.

15. The circuit of claim 14, further comprising:
a second frequency divider, having an input coupled to the output of said phase-locked loop, having an output coupled to said feedback input of said phase-locked loop, and coupled to said select input;
wherein the ratio of the multiples of said second and first frequency dividers corresponds to the selected frequency multiple of said reference clock signal to be generated by said phase-locked loop.

16. The circuit of claim 12, wherein said output of said first frequency divider is coupled to a feedback input of said phase-locked loop;
wherein said first frequency divider has an input coupled to the output of said phase-locked loop;
and wherein a first input of said phase-locked loop is coupled to receive said reference clock signal.

17. A method of operating a phase-locked loop-based clock generator circuit to change the frequency of the signal at its output responsive to a transition of a select signal applied to said circuit, said circuit including a phase-locked loop, said method comprising:
detecting the transition of said select signal indicating a new frequency of operation for said circuit;
responsive to said detecting step, decoupling the output of said phase-locked loop from the output of said clock generator circuit for a period of time;
coupling a stable clock signal to the output of said clock generator circuit for said period of time; and
after said period of time has elapsed, coupling the output of said phase-locked loop to the output of said clock generator circuit and decoupling said stable clock signal from the output of said clock generator circuit.

18. The method of claim 17, wherein said coupling and decoupling steps are each performed by controlling a multiplexer, said multiplexer having inputs for receiving the output of said phase-locked loop and said stable clock signal, and having an output coupled to the output of said clock generator circuit.

19. The method of claim 18, wherein said period of time is determined by a timer.

20. The method of claim 17, wherein an input of said phase-locked loop is coupled to a reference clock signal; and wherein said stable clock signal is generated from said reference clock signal.

21. The method of claim 20, wherein said reference clock signal is coupled to the input of said phase-locked loop by way of a frequency divider adapted to divide the reference clock signal by a selected multiple;
and further comprising:
selecting the multiple of said frequency divider according to the value of s id select signal.

22. A method of controlling the operation of a clock generator circuit including a phase-locked loop, for generating an output clock signal having a frequency selectable by way of a select signal, comprising the steps of:
coupling the output of said phase-locked loop to a first input of a multiplexer, said multiplexer having first and second inputs and a control input, said multiplexer having an output for presenting the output clock signal;
coupling a stable clock signal to the second input of said multiplexer;
detecting a transition of said select signal which indicates selection of a different frequency for said output clock signal;
responsive to said detecting step, applying a first signal to the control input of said multiplexer so that said multiplexer selects said stable clock signal for connection to its output;
after a duration of time has elapsed after said applying step, applying a second signal to the control input of said multiplexer so that said multiplexer selects the output of said phase-locked loop for connection to its output.

23. The method of claim 22, further comprising:
measuring said duration of time after said applying step with a timer.

24. The method of claim 23, wherein said timer comprises a counter.

25. The method of claim 22, wherein a reference clock signal is coupled to an input of said phase-locked loop;
and wherein said stable clock signal is generated from said reference clock signal.

26. The method of claim 22, wherein a reference clock signal is coupled to an input of said phase-locked loop by way of a frequency divider, said frequency divider adapted to divide the reference clock signal by a selected multiple for application to the input of said phase-locked loop;
and further comprising:
selecting the multiple of said frequency divider according to the value of said select signal.

27. The method of claim 22, further comprising:
determining said duration of time from the frequency acquisition time of said phase-locked loop.

28. The method of claim 27, wherein said determining step comprises monitoring said phase-locked loop.

* * * * *